United States Patent
Scherer

(10) Patent No.: US 9,477,273 B2
(45) Date of Patent: Oct. 25, 2016

(54) MOUNTING RAIL FOR AN INSERT ASSEMBLY

(75) Inventor: August Scherer, Dinkelscherben (DE)

(73) Assignee: Fujitsu Technology Solutions Intellectual Property GmbH (DE)

( * ) Notice: Subject to any disclaimer, the term of this patent is extended or adjusted under 35 U.S.C. 154(b) by 678 days.

(21) Appl. No.: 13/989,901

(22) PCT Filed: Nov. 21, 2011

(86) PCT No.: PCT/EP2011/070590
§ 371 (c)(1),
(2), (4) Date: Jul. 19, 2013

(87) PCT Pub. No.: WO2012/072440
PCT Pub. Date: Jun. 7, 2012

(65) Prior Publication Data
US 2013/0336714 A1    Dec. 19, 2013

(30) Foreign Application Priority Data
Nov. 30, 2010    (DE) ........................ 10 2010 052 928

(51) Int. Cl.
*G06F 1/18* (2006.01)
*G11B 33/12* (2006.01)
*H05K 7/14* (2006.01)

(52) U.S. Cl.
CPC .............. *G06F 1/187* (2013.01); *G11B 33/124* (2013.01); *H05K 7/1405* (2013.01); *H05K 7/1409* (2013.01); *Y10T 403/595* (2015.01)

(58) Field of Classification Search
CPC ............ G06F 1/16; G06F 1/18; G06F 1/184; G06F 1/187; G11B 33/122; G11B 33/123; G11B 33/124; G11B 33/128; H05K 5/00; H05K 7/14; H05K 7/1405; H05K 7/1409; H05K 7/1411; H05K 7/1418
See application file for complete search history.

(56) References Cited

U.S. PATENT DOCUMENTS

| 3,476,258 A | * | 11/1969 | Dorsett ................ H05K 7/1409 211/41.17 |
| 4,083,616 A | * | 4/1978 | McNiece ............ E05B 17/0025 439/157 |
| 4,614,389 A | * | 9/1986 | Albert .................. H05K 7/1409 439/144 |
| 5,140,501 A | * | 8/1992 | Takahashi ............ H05K 7/1409 211/41.17 |

(Continued)

FOREIGN PATENT DOCUMENTS

| DE | 102 03 390 A1 | 8/2003 |
| DE | 102 13 526 A1 | 10/2003 |

(Continued)

OTHER PUBLICATIONS

Japanese Office Action dated May 27, 2014 from corresponding Japanese Patent Application No. 2013-541288 along with English translation.

*Primary Examiner* — Daniel Wiley
(74) *Attorney, Agent, or Firm* — DLA Piper LLP (US)

(57) ABSTRACT

A mounting rail for an insert assembly provided to fix in an installation frame of a computer includes one bearing surface to fix in a guide rail of the installation cage, one fastening for the insert assembly, whereby the mounting rail can be fixed laterally on the insert assembly, and a lever at a first end wherein the lever is mounted on a shaft such that an eccentric shape is formed and, by actuating the lever in an installed state, the mounting rail is lifted in a direction of the insert assembly.

9 Claims, 7 Drawing Sheets

(56) References Cited

U.S. PATENT DOCUMENTS

| | | | |
|---|---|---|---|
| 6,067,225 A | 5/2000 | Reznikov et al. | |
| 6,102,499 A | 8/2000 | Chen et al. | |
| 6,185,106 B1* | 2/2001 | Mueller | H05K 7/1409 361/754 |
| 6,456,501 B1* | 9/2002 | Rubenstein | G11B 33/128 211/41.17 |
| 6,582,241 B1* | 6/2003 | Lutz, Jr. | H01R 12/7005 439/157 |
| 6,882,526 B2* | 4/2005 | Neukam | G06F 1/184 361/679.39 |
| 6,948,967 B2* | 9/2005 | Scherer | G11B 33/128 361/727 |
| 6,970,350 B2* | 11/2005 | Schmid | G06F 1/181 211/41.17 |
| 7,272,012 B2* | 9/2007 | Salinas | H05K 7/1409 312/223.1 |
| 7,301,778 B1* | 11/2007 | Fang | H05K 7/1487 312/223.2 |
| 7,515,428 B2* | 4/2009 | Tang | G06F 1/188 361/727 |
| 7,755,887 B2 | 7/2010 | Chen et al. | |
| 2003/0184964 A1 | 10/2003 | Neukam et al. | |
| 2008/0025000 A1* | 1/2008 | Huang | H05K 7/1409 361/726 |
| 2009/0279249 A1* | 11/2009 | Crippen | G06F 1/187 361/679.58 |

FOREIGN PATENT DOCUMENTS

| | | |
|---|---|---|
| DE | 10 2007 024 896 B3 | 5/2008 |
| JP | 44-22888 | 9/1969 |
| JP | 9-505418 | 5/1997 |
| JP | 2001-307468 | 11/2001 |
| WO | 2005/093482 A1 | 10/2005 |

* cited by examiner

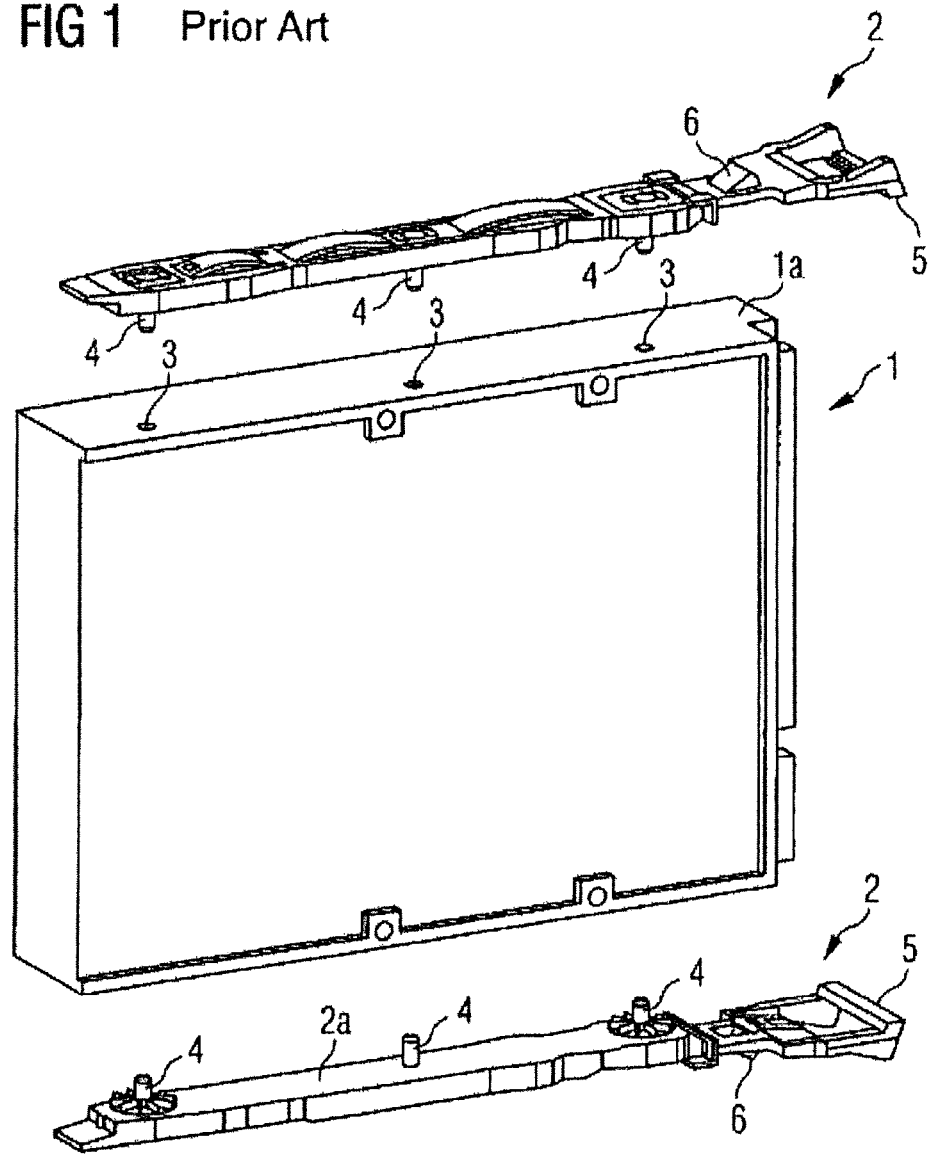

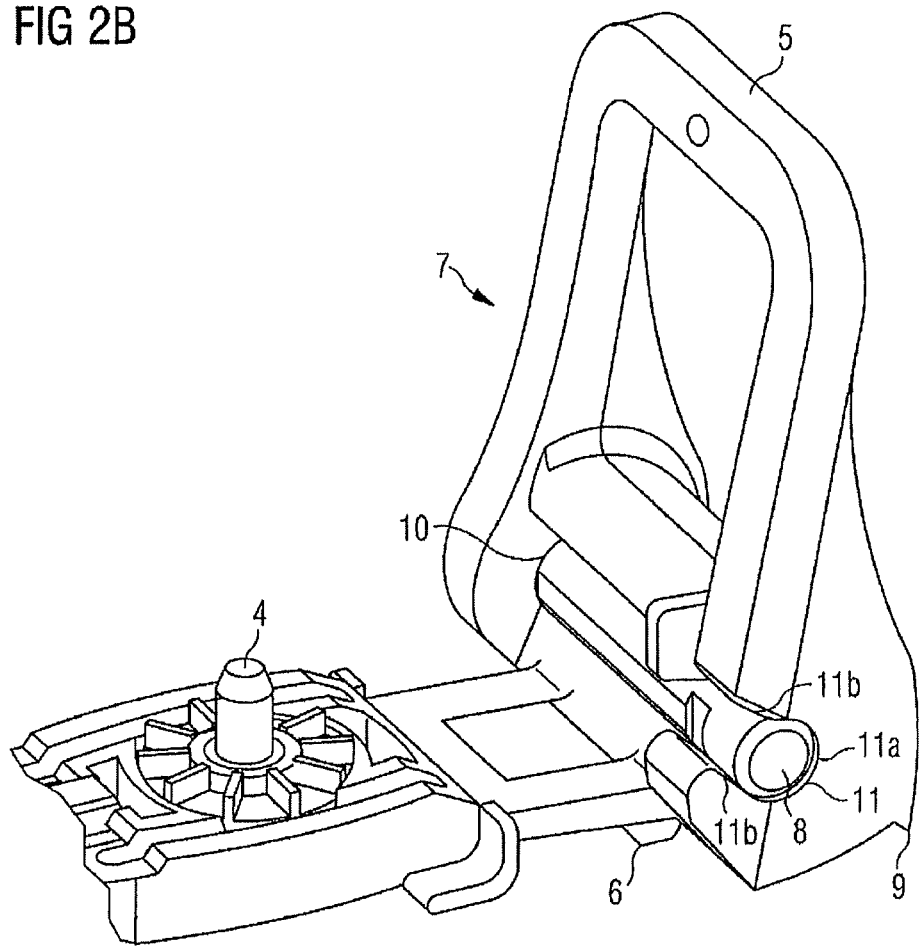

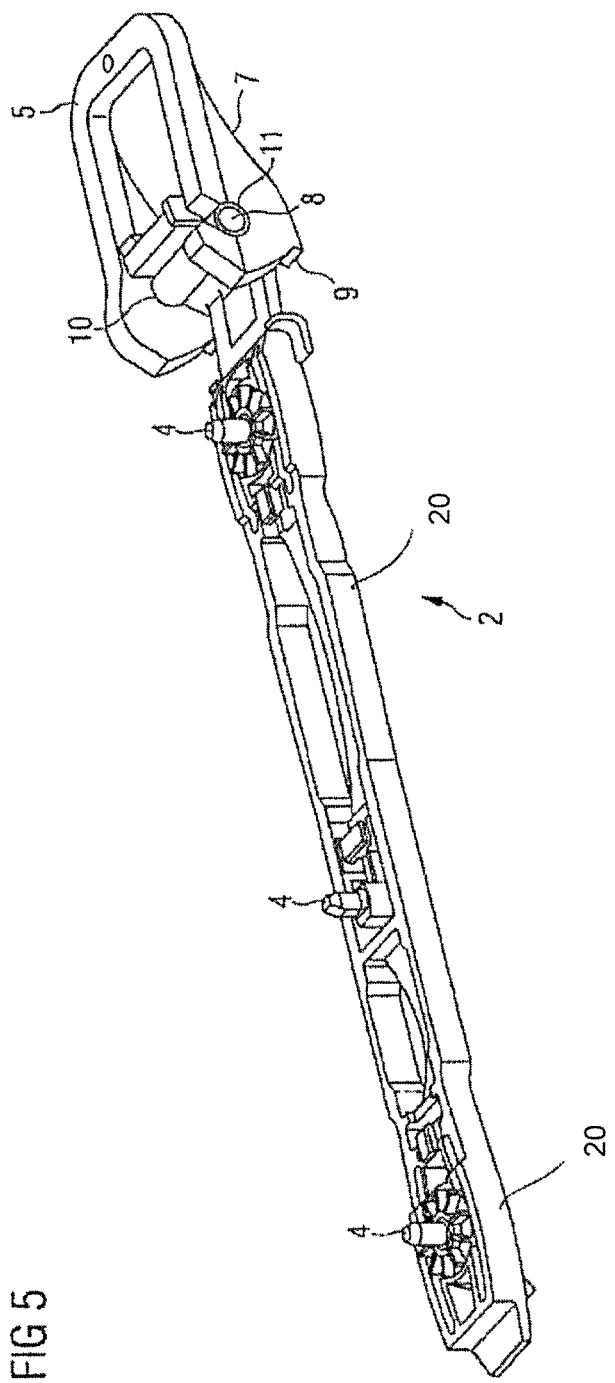

MOUNTING RAIL FOR AN INSERT ASSEMBLY

TECHNICAL FIELD

This disclosure relates to a mounting rail for an insert assembly provided to fix a computer in an installation cage. The disclosure also relates to an arrangement to fix an insert assembly in an installation cage of a computer.

BACKGROUND

Mounting rails of the above-mentioned type allow, inter alia, a particularly simple and quick installation and dismantling of insert assemblies, in particular disk drives, in a computer housing. The disk drives can be fitted without difficulty into plug connectors on the rear face of the installation cage, the plug connectors being clipped into place in a stable sheet metal part. In contrast, removal of the disk drives from the plug connector is problematic with the known disk drive rails since the insertion force of the disk drive connections in the plug connector is much too high.

Until now, disk drive rails of the above-mentioned type were equipped with a grip which, in the installed state, protrudes from the installation cage of the computer. An insert assembly is generally fastened laterally to two rails on opposite sides of the insert assembly (see FIG. 1). The insert assembly including two mounting rails is slid along the guide rails of the installation cage into the installation cage. Each mounting rail generally comprises a detent lug at the end equipped with the grip, the detent lug engaging in the installed state in an opening in the installation cage and thus fixing the mounting rail on the installation cage. To remove the insert assembly with the mounting rails from the installation cage, the grips of both mounting rails first have to be bent slightly in the direction of the insert assembly to release the detent lug from the engagement opening. The mounting rails can then be removed by pulling on the respective grips. As already explained above, pulling alone on the grips of the mounting rails to remove the mounting rails together with the insert assembly from the installation cage can only be achieved with difficulty, if at all, when the insert assembly is additionally inserted in a plug connector.

It could therefore be helpful to provide a cost-effective mounting rail for an insert assembly and also an arrangement to fix an insert assembly in an installation cage of a computer, which facilitates removal of insert assemblies, in particular plugged-in insert assemblies.

SUMMARY

I provide a mounting rail for an insert assembly provided to fix in an installation cage of a computer, including one bearing surface to fix in a guide rail of the installation cage, one fastening for the insert assembly, whereby the mounting rail can be fixed laterally on the insert assembly, and a lever at a first end wherein the lever is mounted on a shaft such that an eccentric shape is formed and, by actuating the lever in an installed state, the mounting rail is lifted in a direction of the insert assembly.

I also provide an arrangement that fixes an insert assembly in an installation cage of a computer, including an installation cage, the mounting rail for an insert assembly provided to fix in an installation cage of a computer, including one bearing surface to fix in a guide rail of the installation cage, one fastening for the insert assembly, whereby the mounting rail can be fixed laterally on the insert assembly, and a lever at a first end wherein the lever is mounted on a shaft such that an eccentric shape is formed and, by actuating the lever in an installed state, the mounting rail is lifted in a direction of the insert assembly and having at least one bearing surface to fix the mounting rail in a guide rail of the installation cage, and at least one fastening, arranged on the mounting rail, for the insert assembly, whereby the mounting rail can be fixed laterally to the insert assembly.

I further provide an arrangement that fixes an insert assembly in an installation cage of a computer, including an installation cage, the mounting rail for an insert assembly provided to fix in an installation cage of a computer, including one bearing surface to fix in a guide rail of the installation cage, one fastening for the insert assembly, whereby the mounting rail can be fixed laterally on the insert assembly, and a lever at a first end wherein the lever is mounted on a shaft such that an eccentric shape is formed and, by actuating the lever in an installed state, the mounting rail is lifted in a direction of the insert assembly, wherein the lever includes at least one lever lug which can press against an edge of the installation cage to press the mounting rail from the installation cage and having at least one bearing surface to fix the mounting rail in a guide rail of the installation cage, at least one fastening arranged on the mounting rail for the insert assembly, whereby the mounting rail can be fixed laterally to the insert assembly, and the installation cage, on surfaces equipped with the guide rail, includes a correspondingly long edge outwardly, against which the lever lug can press to move the mounting rail out from the installation cage.

BRIEF DESCRIPTION OF THE DRAWINGS

FIG. 1 shows a conventional insert assembly and two mounting rails with regard to their fixing in an installation cage.

FIGS. 2A to 2C show a perspective view and a detail of an example of our mounting rail.

FIG. 5 shows a perspective view of a mounting rail with the lever in the unlatched position.

Figure 2A:
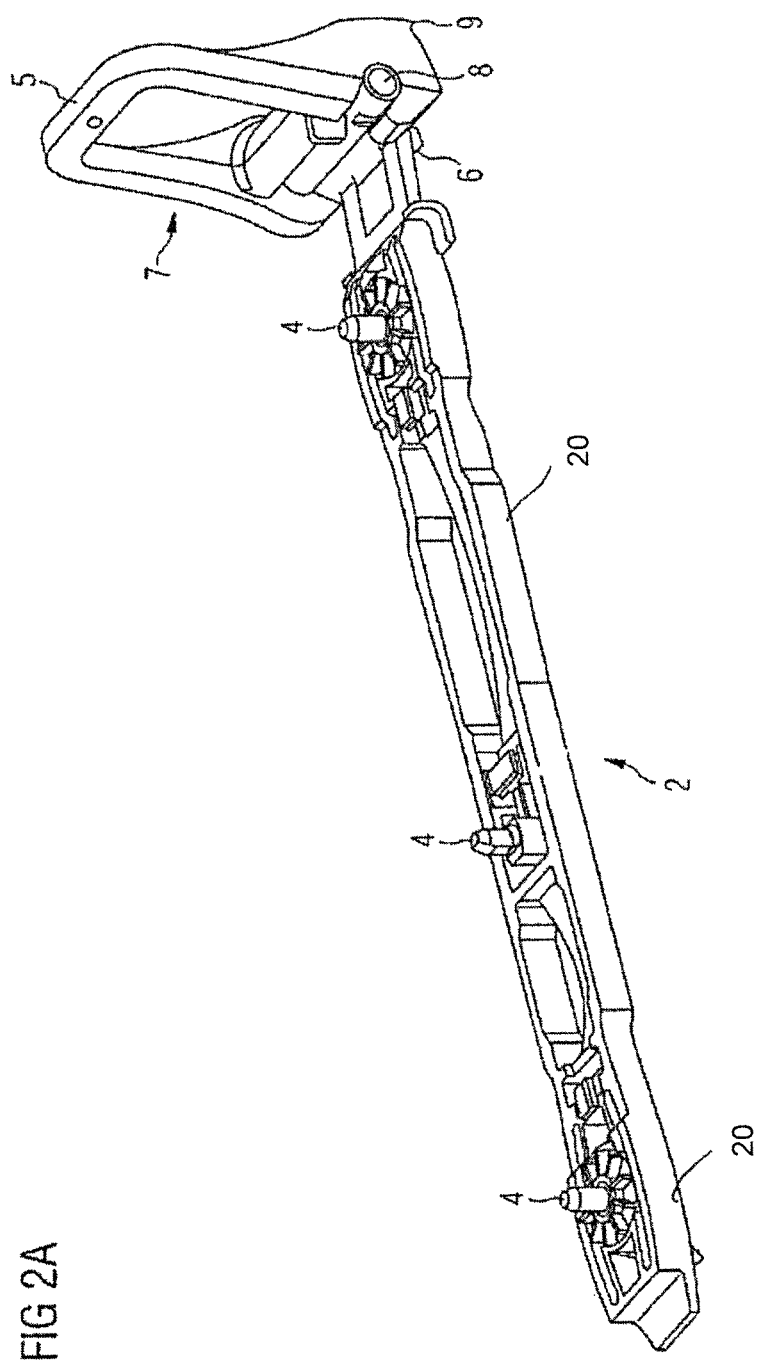

LIST OF REFERENCE SIGNS 1 insert assembly
1a side face of the insert assembly
2 mounting rail
2a side face of the mounting rail
3 fastening opening of the insert assembly
4 mounting pin
5 grip
6 detent lug
7 lever
8 shaft
9 lever lug
10 opening in the lever
11 recess in the lever
12 installation cage
13 engagement opening
14 edge of the installation cage

DETAILED DESCRIPTION

I provide a mounting rail comprising a lever at a first end. Instead of being equipped just with a grip, the mounting rail is equipped with a lever assembled on the mounting rail via a shaft.

The lever is preferably assembled eccentrically on the shaft, thus producing an eccentric. The eccentric is rotatable about the shaft and has the function of releasing the latching of the mounting rail in the installation cage. The mounting rail preferably comprises a detent lug, which latches into a corresponding opening in the installation cage (referred to hereinafter as an engagement opening) when the mounting rail is installed in the installation cage. By actuating the lever, the installed mounting rail is automatically lifted upwardly by the eccentric and is therefore lifted out of the engagement opening in the installation cage.

The lever is preferably additionally equipped with a lug which can press against an edge of the installation cage to lever the unlatched mounting rail from the installation cage. If the insert assembly is already plugged in, the lever generates sufficient force so that the user can pull the insert assembly from the plug connector in a controlled manner. The lever can then be used as a grip to completely remove the released insert assembly with the mounting rails.

My mounting rails will be explained in greater detail hereinafter in an example with reference to the drawings.

FIG. 1 shows an insert assembly 1 and two mounting rails 2 with regard to their fixing in an installation cage (not illustrated here). The insert assembly 1 comprises three fastening openings 3 in each of its side faces 1a. The mounting rail 2 comprises on a side face 2a three mounting pins 4 provided to engage into the three fastening openings 3. Furthermore, the mounting rail 2 comprises a grip 5 and a detent lug 6 at one end. The grip 5 is used to remove the insert assembly 1 from the installation cage, and the detent lug 6 is used to latch the mounting rail 2 with the insert assembly 1 in a corresponding engagement opening in the installation cage in the inserted state.

To introduce the insert assembly 1 in an insert assembly cage, the two mounting rails 2 are fitted onto the insert assembly such that the side faces 1a and 2a point towards one another and the mounting pins 4 engage into the fastening openings 3. Together with the mounting rails 2 thus fixed, the insert assembly 1 is inserted into the installation cage.

FIG. 2A shows one example of my mounting rail 2 having bearing surfaces 20. Similarly to the mounting rail 2 illustrated in FIG. 1, my mounting rail 2 comprises three mounting pins 4 and, for example, two detent lugs 6 (only one detent lug 6 is visible in FIG. 2A). The detent lugs 6 are arranged at a first end of the mounting rail 2. In contrast to FIG. 1, my mounting rail 2 comprises at the first end a lever 7 with a grip 5 which is assembled on a shaft 8 of the mounting rail 2. The grip 5 is provided to rotate the lever 7 and to pull the mounting rail 2. The lever 7 comprises a lever lug 9.

FIG. 2B shows an enlarged portion of the first end of the mounting rail 2. For assembly, the lever 7 comprises an opening 10 which is round and provided for insertion of one end of the shaft 8, and comprises a recess 11 formed as a round portion 11a and an adjoining slit-like portion 11b.

The diameter of the round portion 11a is approximately as large as the diameter of the shaft 8 so that, after assembly of the lever 7, the shaft 8 is securely held in the round portion 11a of the recess 11 or the round portion 11a of the recess 11 surrounds the shaft 8 in part. The width of the slit-like portion 11b is slightly smaller than the diameter of the shaft 8 so that the shaft 8 in the assembled state cannot slide accidentally from the round portion 11a of the recess 11. The lever 7 is preferably produced from plastic and has a certain resilience. Once one end of the shaft 8 has been inserted into the round opening 10 of the lever 7, the other end of the shaft 8 is pressed through the slit-like portion 11b of the recess 11 until the shaft 8 latches into the round portion 11a. As a result of the pressing of the shaft 8, the two side walls of the slit-like portion 11b are extended away from one another momentarily.

Figure 2C:
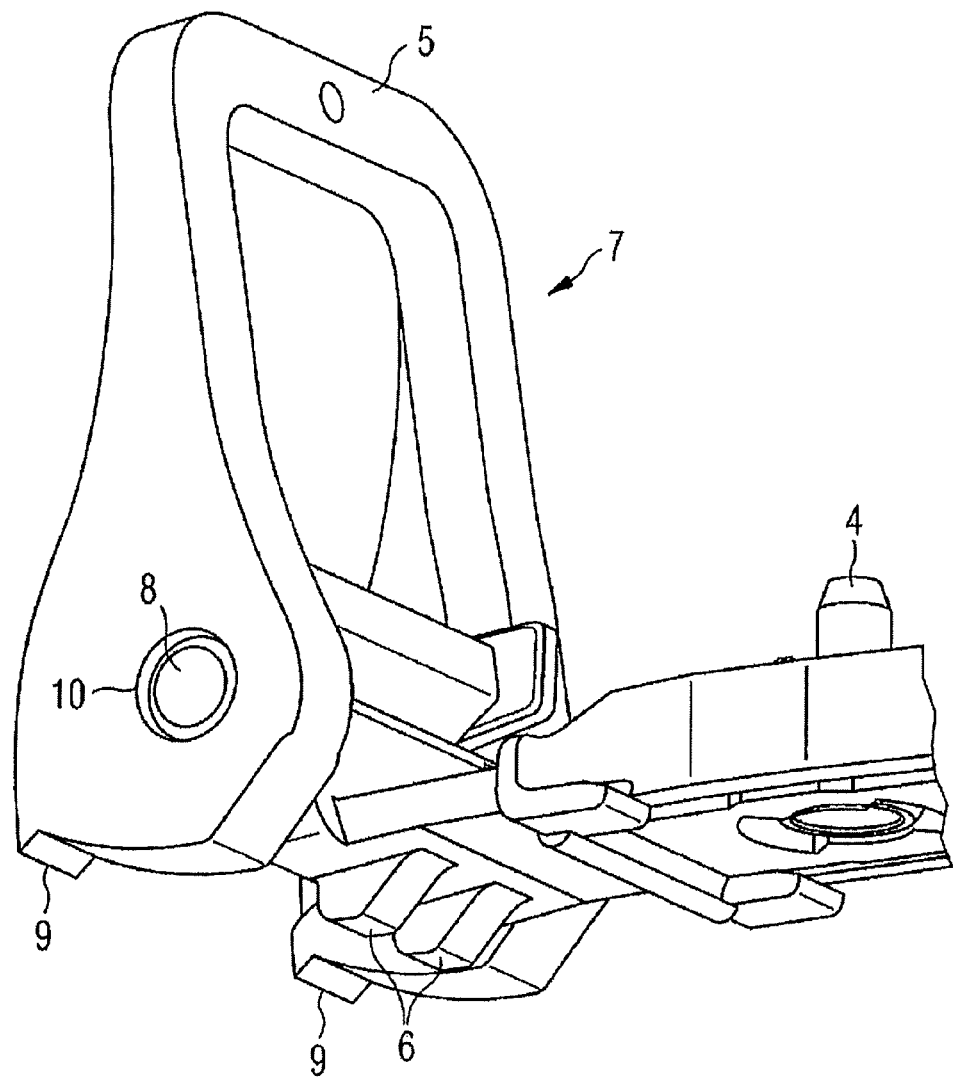

FIG. 2C shows the same portion as FIG. 2B from the side of the round opening 10 of the lever 7. The two detent lugs 6 are visible. The mounting rail 2 with one detent lug 6 is also possible.

Figure 3:
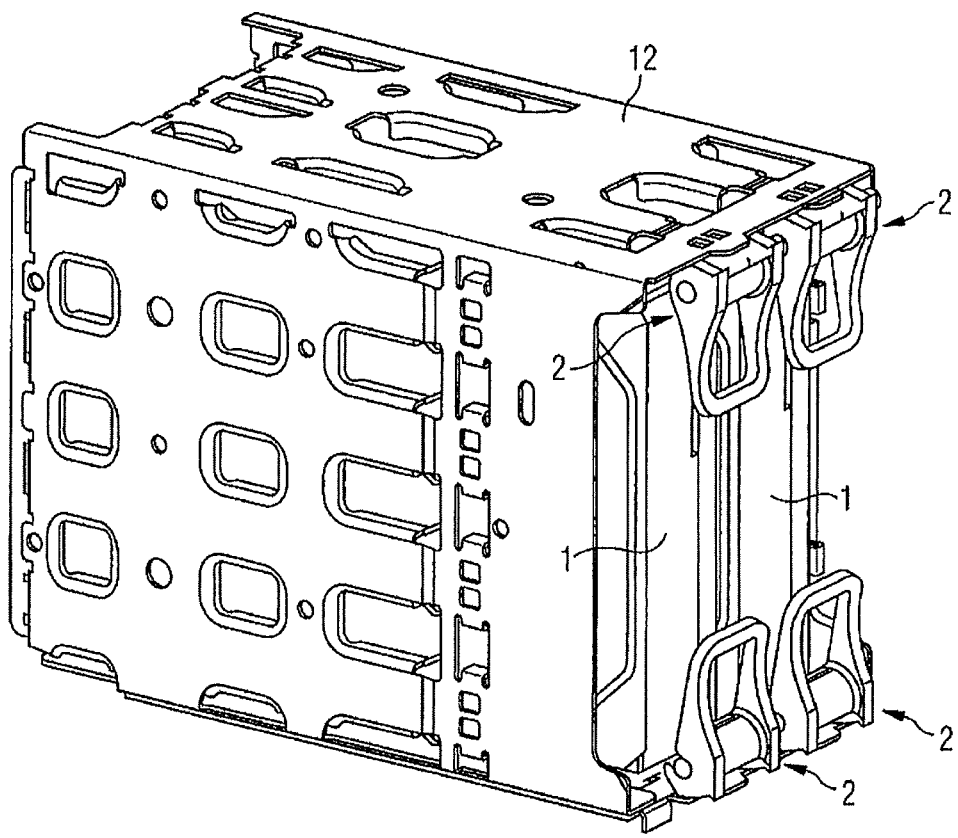
FIG. 3 shows a perspective view of an arrangement with an installed insert assembly.

FIG. 3 shows two insert assemblies 1 which are each equipped with two mounting rails 2 and are already inserted and fixed in an installation cage 12.

Figure 4:
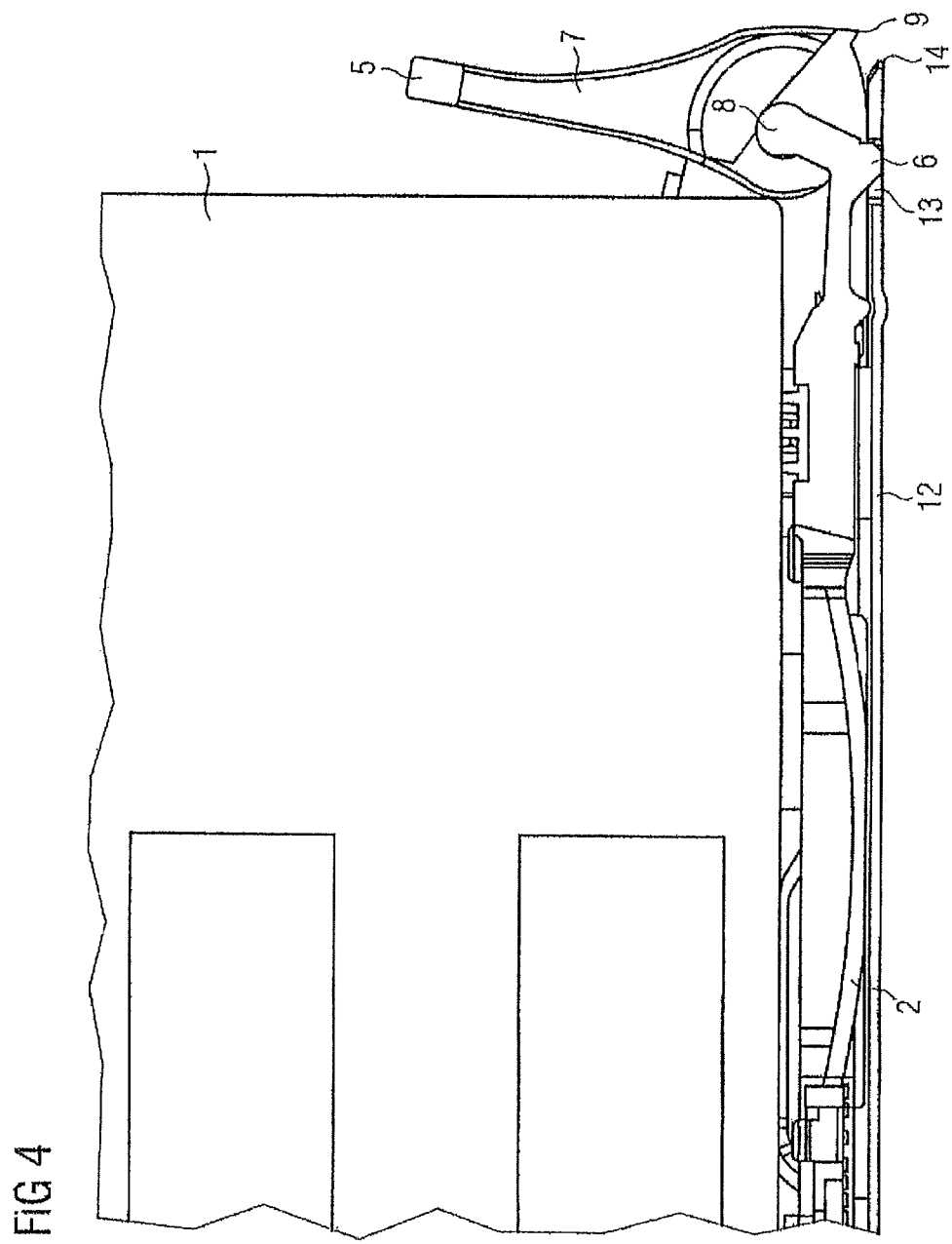
FIG. 4 shows, in cross section, a portion of the arrangement illustrated in FIG. 3.

FIG. 4 shows a cross section of a portion of the arrangement illustrated in FIG. 3. The detent lug 6 of the mounting rail 2 is already latched into an engagement opening 13 of the installation cage 12. The lever 7 is mounted eccentrically about the shaft 8, thus producing an eccentric. As a result of the eccentric, the detent lug 6 is lifted from the engagement opening 13 in the installation cage 12 as the lever 7 is rotated. The detent lug 6 and the shaft 8 are arranged as close as possible to one another to better utilize the lever effect of the eccentric when releasing the detent lug 6 from the engagement opening 13. By subsequently pulling the mounting rail 2, the insert assembly 1 is freed completely from the installation cage 12.

The lever lug 9 is arranged such that, as the lever is rotated, it contacts an edge 14 of the installation cage 12, after which the detent lug 6 is freed from the engagement opening 13. Force can thus additionally be gained in the removal direction. This is necessary when the insert assembly 1 in the installation cage 12 is inserted in a plug connector (not visible in FIG. 4) to overcome the insertion force of the insert assembly 1 in the plug connector.

FIG. 5 shows an example of my mounting rail 2, wherein the lever 7 is illustrated in the open state.

The invention claimed is:

1. A mounting rail for an insert assembly provided to fix in an installation cage of a computer, the mounting rail comprising:
    one bearing surface to fix in a guide rail of the installation cage;
    at least one mounting pin for the insert assembly, whereby the mounting rail can be fixed laterally on the insert assembly;
    a detent lug integrally formed with the mounting rail on an outward portion of a first end of the mounting rail which, in an installed state of the mounting rail on the insert assembly within the installation cage, engages into an engagement opening in the installation cage to fix the mounting rail to the installation cage with respect to a direction of insertion;
    a shaft formed on an inward portion of the first end of the mounting rail; and
    a lever rotatably attached about said shaft, said lever comprising an eccentric portion at a first end thereof that is eccentric with respect to the shaft, and a grip at a second end thereof opposite the first end,
    wherein by rotating the grip of the lever away from the insert assembly, the shaft of the mounting rail is lifted in a direction toward the insert assembly and the detent lug is lifted out of the engagement opening.

2. The mounting rail according to claim 1, wherein the lever is mounted such that, by actuating the lever in the installed state, the mounting rail is moved from the installation cage.

3. The mounting rail according to claim 2, wherein the lever comprises at least one lever lug which can press against an edge of the installation cage to press the mounting rail from the installation cage.

4. An arrangement that fixes an insert assembly in an installation cage of a computer, comprising:
   an installation cage;
   the mounting rail according to claim 2, wherein the at least one bearing surface fixes the mounting rail in a guide rail of the installation cage; and
   at least one mounting pin, arranged on the mounting rail, for the insert assembly, whereby the mounting rail can be fixed laterally to the insert assembly.

5. The mounting rail according to claim 1, wherein the lever comprises at least one lever lug on the eccentric portion which, when the lever is rotated, can press against an edge of the installation cage to move the mounting rail from the installation cage along the direction of insertion.

6. An arrangement that fixes an insert assembly in an installation cage of a computer, comprising:
   an installation cage:
   the mounting rail according to claim 5, wherein the at least one bearing surface fixes the mounting rail in a guide rail of the installation cage;
   at least one mounting pin arranged on the mounting rail for the insert assembly, whereby the mounting rail can be fixed laterally to the insert assembly; and
   the installation cage, on surfaces equipped with the guide rail, comprises a correspondingly long edge outwardly, against which the lever lug can press to move the mounting rail out from the installation cage.

7. An arrangement that fixes an insert assembly in an installation cage of a computer, comprising:
   an installation cage;
   the mounting rail according to claim 5, wherein the at least one bearing surface fixes the mounting rail in a guide rail of the installation cage; and
   at least one mounting pin arranged on the mounting rail, for the insert assembly, whereby the mounting rail can be fixed laterally to the insert assembly.

8. An arrangement that fixes an insert assembly in an installation cage of a computer, comprising:
   an installation cage;
   the mounting rail according to claim 1, wherein the at least one bearing surface fixes the mounting rail in a guide rail of the installation cage; and
   at least one mounting pin arranged on the mounting rail, for the insert assembly, whereby the mounting rail can be fixed laterally to the insert assembly.

9. The arrangement according to claim 8, wherein two mounting rails are laterally mounted on side walls of the insert assembly.

\* \* \* \* \*